United States Patent [19]
Zens

[11] Patent Number: 4,654,592
[45] Date of Patent: Mar. 31, 1987

[54] CONCURRENT NMR ANALYSIS OF MULTIPLE SAMPLES

[75] Inventor: Albert P. Zens, Fremont, Calif.

[73] Assignee: Varian Associates, Inc., Palo Alto, Calif.

[21] Appl. No.: 691,337

[22] Filed: Jan. 14, 1985

[51] Int. Cl.[4] ............................................. G01R 33/20
[52] U.S. Cl. ..................................... 324/307; 324/318
[58] Field of Search .............. 324/307, 308, 318, 321, 324/300; 436/173

[56] References Cited
U.S. PATENT DOCUMENTS

| | | | |
|---|---|---|---|
| 3,173,083 | 3/1965 | Anderson et al. | 324/308 |
| 3,434,043 | 3/1969 | Nelson | 324/310 |
| 3,531,715 | 9/1970 | Watson | 324/308 |
| 3,846,333 | 11/1974 | Sievers | 436/173 |

OTHER PUBLICATIONS
Banas, "Multi-Cloistered", NMR Cells, Applied Spectroscopy, vol. 23, No. 1, 1969.

*Primary Examiner*—Stewart J. Levy
*Assistant Examiner*—Kevin D. O'Shea
*Attorney, Agent, or Firm*—Stanley Z. Cole; Edward H. Berkowitz

[57] ABSTRACT

Multiple concurrent sample processing in a single spectrometer is accomplished for the respective situation of (a) samples of strongly dissimilar character and (b) samples of similar character. For the class (a) samples yielding non-superimposed line spectra are axially separated by susceptibility matched delimiters in a sample tube and analyzed in a conventional spectrometer. For the class (b), resonance response from axially separated samples induce signals in respective observe coils similarly spaced along the axis of said sample tube. Plural samples disposed in non-colinear parallel alignment are also treated in this manner.

3 Claims, 10 Drawing Figures

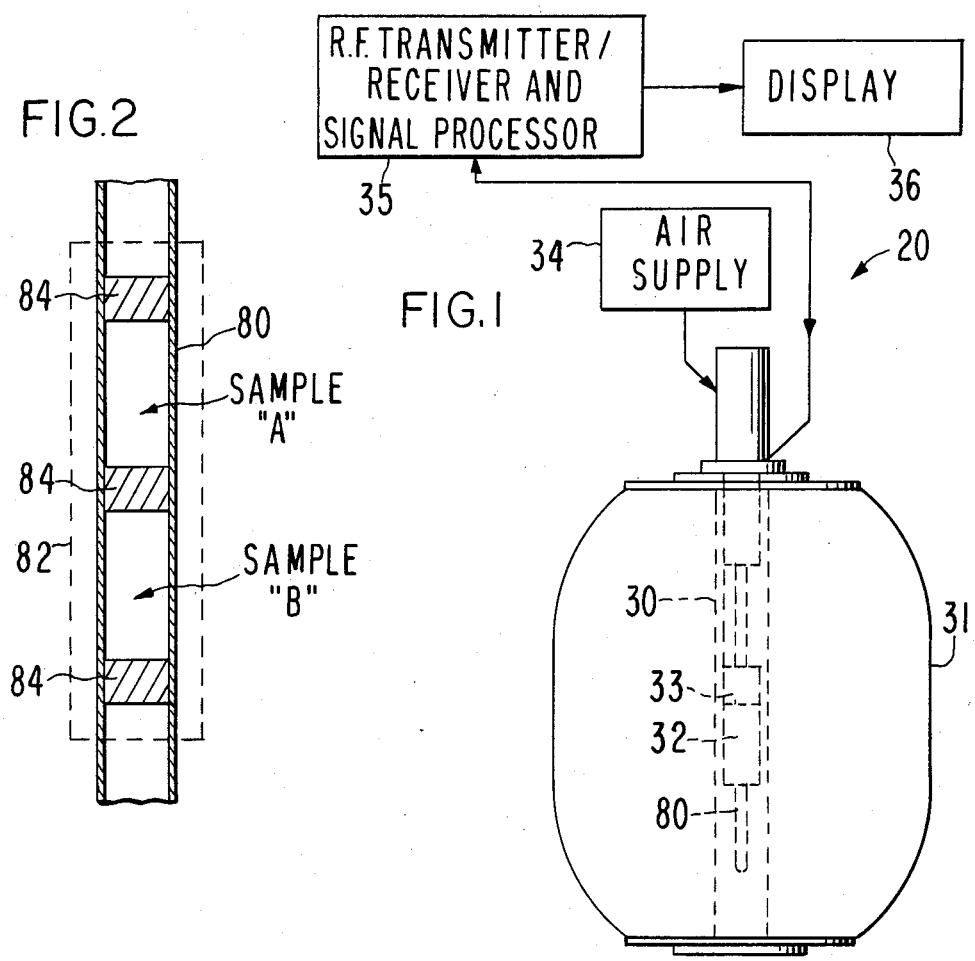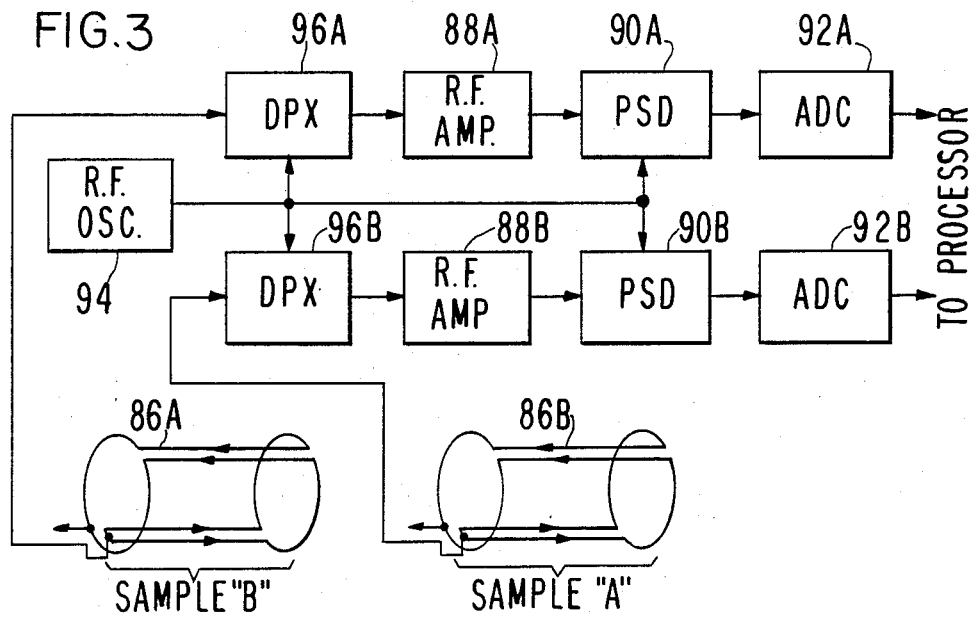

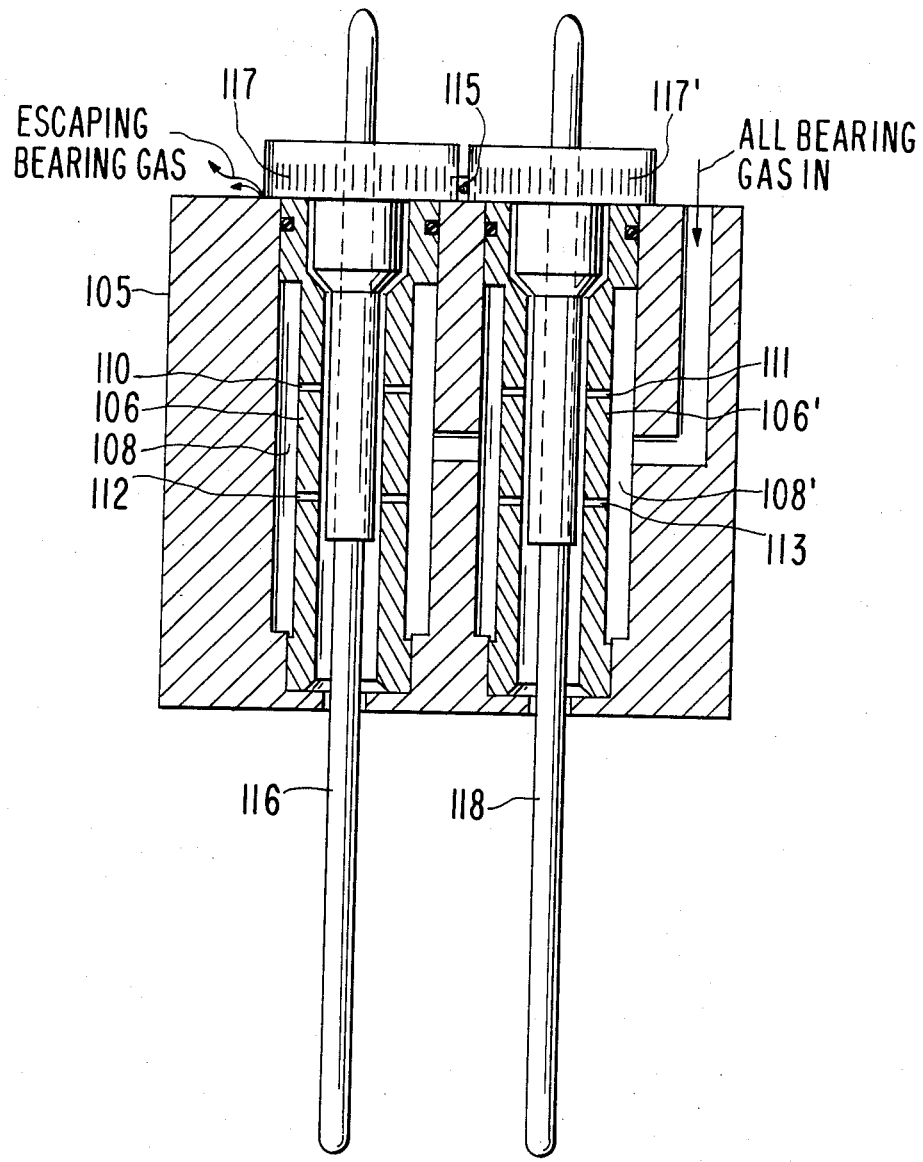

CONCURRENT NMR ANALYSIS OF MULTIPLE SAMPLES

FIELD OF THE INVENTION

The present invention is in the field of nuclear magnetic resonance apparatus and relates particularly to the concurrent analysis of multiple discrete samples.

BACKGROUND OF THE INVENTION

In the prior art nuclear magnetic resonance analysis has, in particular instances been directed at composite samples for concurrent measurement. For example, it has been known to employ multiple discrete samples to construct phantoms for NMR imaging studies. In one typical example such a phantom comprises several sample tubes arranged with axes parallel with and subject to an inhomogeneous magnetic field of controlled gradient. Spatial discrimination is the object of such apparatus and the output derived is proportional to spatial coordinates describing the density distribution of the discrete samples (of identical composition) forming the phantom. All samples in such instance are of a single common substance for which the resonance frequency varies in accord with the field gradient.

It is also known in the prior art to extract data from an observe channel and a lock channel of an NMR spectrometer. In one class of experiment a calibration substance is intermixed in the sample ("internal reference") as described in U.S. Pat. Nos. 3,427,532 and 3,530,371. The samples are not "discrete" because it is desired to obtain field sampling distributed over the same volume as occupied by the sample of interest. In another class of lock channel apparatus the signal from a calibration substance is separately analyzed ("external reference") to produce a field-frequency control signal for maintaining a constant ratio of polarizing field to excitation frequency. Examples of this type of lock channel apparatus are U.S. Pat. Nos. 3,495,162 and 3,434,043. For both internal and external references, it is important to recognize that this known substance is a reference and not subject to "analysis." Rather, the reference provides a signal for actuating a control loop. In the context of lock channel systems, a reference provides a decidedly known spectral feature, the position of which is fixed by definition for the known lock system, and the spectral response of the instrument for the analyte is affected by the lock channel. Thus, the reference and the sample spectral responses are not each free to vary independently.

It is also known in prior art to confine a sample in an axial direction within a sample tube by use of plugs selected by the magnetic susceptibility of the plug material. The volume magnetic susceptibility of the plug is matched to that of the gross volume magnetic susceptibility of the sample solution such that no axial discontinuity is introduced by the plug. In this manner the axial extent of the sample may be defined within a selected portion of the sensitive volume of the probe coil of a magnetic spectrometer. This technique is described in U.S. Ser. No. 482,344, U.S. Pat. No. 4,549,137.

For the present invention it is assumed that a large sample volume does not substantially improve the quality of the spectrometer analysis for the purposes of the investigation. The present apparatus, in one embodiment, is designed to improve throughput for a plurality of samples to be analyzed.

Throughput is improved in the present invention by performing analyses of a plurality of samples concurrently. It is recognized that many subsystems can be effectively shared among a number of samples. For example, the polarizing field and the RF excitation apparatus are capable of operating upon several samples concurrently present in the sensitive volume of the spectrometer. As discussed herein, the signal processing apparatus may be partitioned to separately address commonly excited samples, or where the samples are suitably disparate in spectral response, a single RF signal processor apparatus is adequate to process the superposition of signals.

In another embodiment, concurrent analysis of disparate samples is exploited where it is again desired to improve throughput obtaining superimposed spectra, the features of which are adequately attributable to respective samples. In a slightly different operative context, one said disparate sample serves functionally as an analytic, or spectral, reference (as opposed to an instrumental reference in lock systems discussed above). The spectral amplitude or position of a reference feature is added for comparative purposes to the composite spectrum.

BRIEF DESCRIPTION OF THE FIGURES

FIG. 1 is a simple block diagram of an impulse NMR spectrometer.

FIG. 2 shows a multiple discrete sample tube for analysis in the present invention.

FIG. 3 describes one form of apparatus wherein separate observe coils correspond to the separate samples.

FIG. 6 shows an arrangement for spinning multiple parallel non-colinear aligned samples.

DETAILED DESCRIPTION OF THE INVENTION

Figure 4A:
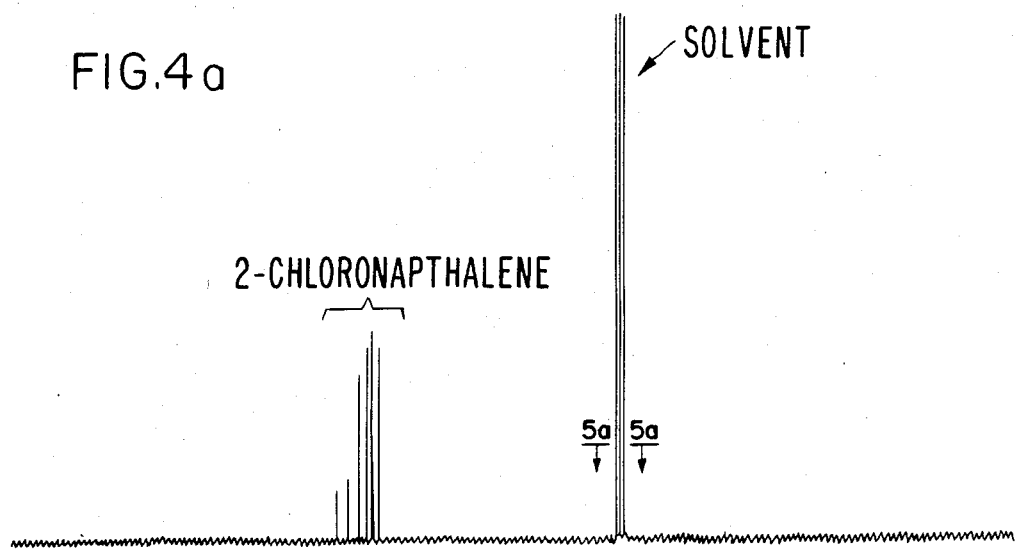
FIG. 4(a) is a spectrum of 2-Cl naphthalene in deuterated chloroform.

The context of the present invention is best described with the aid of FIG. 1 which depicts a simplified block diagram of a typical NMR analysis system. A high field superconducting magnet 31 is housed in a cryostat which features a room temperature bore 30 in which a probe module 32 is located. Secured to the top of the probe module is a spinner assembly 33 which receives a sample tube 80. Spinner assembly 33 supports the high speed rotation of the sample tube in the axial magnetic field of superconducting magnet 31, such spinning implemented through pressurized air supply 34 connected to the spinner to provide rotation thereto. An RF transmitter/receiver and signal processor 35 is connected to the probe subsystem 32, which probe includes means, not shown, for exciting and detecting resonance spectra of a sample in the sample tube. The signal processor also includes means for deriving and displaying the spectral distribution of a sample under examination as indicated schematically by display means 36.

Turning now to FIG. 2, there is shown sample tube 80 on the axis of and within sensitive volume 82 of the spectrometer. The sample tube 80 has placed within it N+1 susceptibility plugs 84 to divide the sample space within the sample tube 80 into N subspaces. The subspaces are each filled with respective samples for analysis. The susceptibility plugs are selected as discussed in U.S. Pat. No. 4,549,137 to present little, if any, magnetic disturbance to the sample space while precisely delimiting the axial interval occupied by the respective samples. (A single susceptability plug clearly suffices to create two sample subspaces, each extending well past the axial extremes of the sensitive volume.)

Where the samples for analysis are analytically similar, it is preferred that the separate sample spaces be separately addressed by corresponding sample coils as indicated in the embodiment of FIG. 3. The separate coils 86A and 86B define respective receiving channels comprising RF amplifiers 88A and 88B, phase sensitive detectors 90A and 90B and analog-to-digital converters 92A and 92B. It is then convenient for the processor to read the respective latched ADC outputs in turn and perform respective processing in turn. RF oscillator 94 provides excitation commonly to each coil through appropriate duplexers 96A and 96B. It is recognized that excitation may be supplied to a single excitation coil comprehending the several sample spaces and respective observe coils. It is apparent that separate spectra corresponding to the respective samples are the result of the multiple analyses of FIG. 3 apparatus.

Figure 4B:
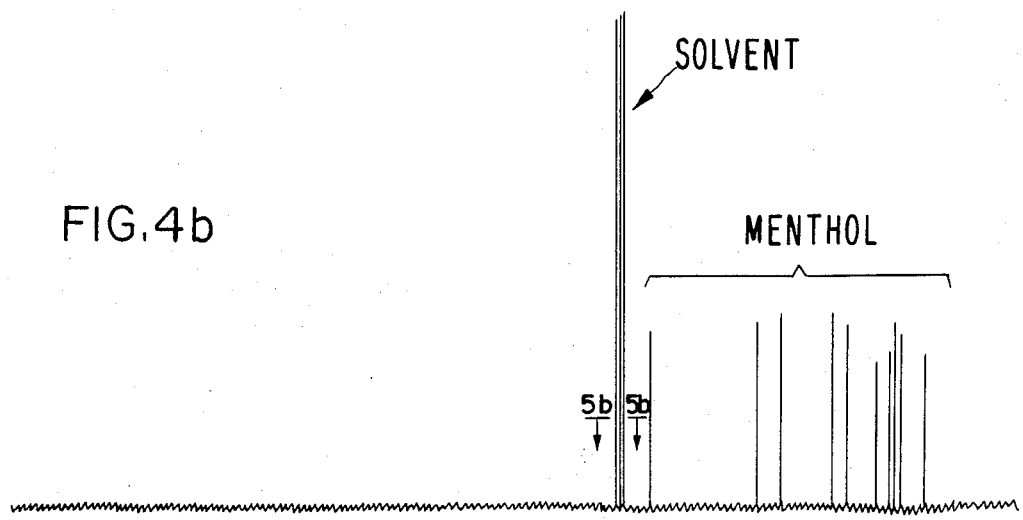
FIG. 4(b) is a spectrum of Menthol in deuterated chloroform.
Figure 4C:
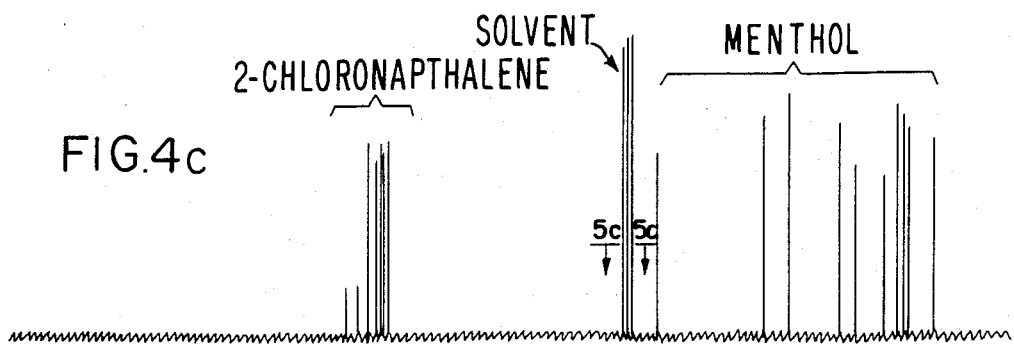
FIG. 4(c) is a sample spectrum wherein signal response from two separate samples (corresponding to (a) and (b) above) is mixed in a single observe coil.
Figure 5A:
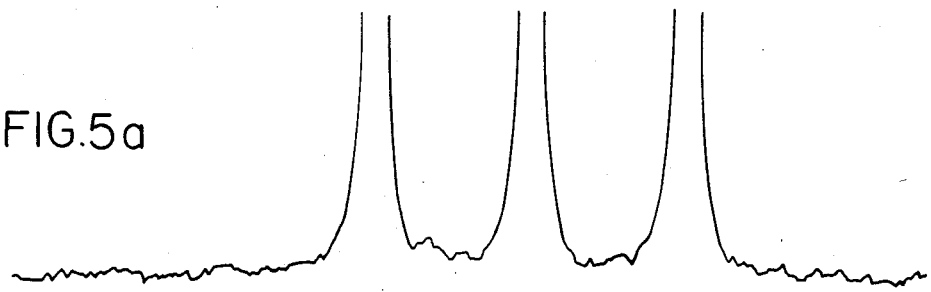
FIGS. 5(a)-(c) show the solvent line detail on an expanded scale.
Figure 5B:
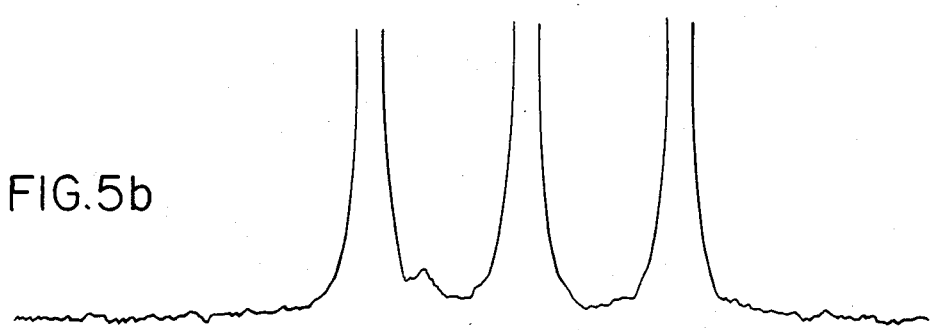
Figure 5C:
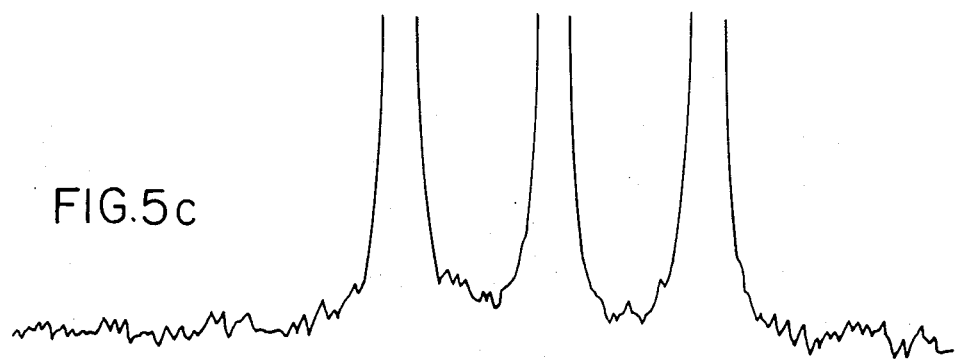

In another embodiment, samples of sufficiently disparate character are presented for concurrent analysis utilizing a sample tube 80 in the manner of FIG. 2 placed in an otherwise conventional spectrometer comprising a single observe coil to geometrically span the several sample spaces. The signals are mixed in the observe coil and the receiver channel will, upon Fourier transformation, exhibit a super position of the spectra. An example of this embodiment is shown in FIGS. 4(a-c). FIG. 4(a) is a conventionally obtained spectrum of 2-Chloronapthalene is deuterated chloroform and FIG. 4(b) is a similarly obtained spectrum of menthol in the same solvent. Using a sample tube of the structure of FIG. 2 the respective samples are placed in corresponding cells defined by plugs 84 (here, Vespel type polylmide) and the combined spectrum of FIG. 4(c) is obtained without re-shimming of the spectrometer magnet. The data of FIGS. 4(a)-(c) in the vicinity of the solvent lines are shown on an expanded ordinate in FIGS. 5(a)-(c) respectively. The difference between the multiple sample spectrum (FIG. 5(c)) and either single sample spectrum is not notably more pronounced than is the difference between the two single sample spectra. In particular, no doubling of individual spectral lines is observed. FIG. 5(c) may be compared to either of 5(a) and 5(b) to show that tails of the peaks are not significantly emphasized in the composite solvent peaks. Consequently, local distortion of the magnetic field (due to the plugs 84) is almost unobservable. It is apparent that sample pairs selected to yield well separated discrete spectral lines in the superposed spectra will have little effect upon one another for many analytical purposes.

The above description has shown and discussed axially aligned multiple sample arrangements. Multiple samples can also be disposed in parallel non-colinear alignment with the practice of the present invention. In such parallel aligned geometry, a radial inhomogeneity is inherently introduced in the sample space. The magnitude of the effect is dependent on many parameters and the susceptibilities of the substances forming the sample and sample tubes, but for the general situation averaging of the inhomogeneity can be accomplished by spinning. In parallel aligned geometry the individual samples are adapted to rotate about their respective axes to average a local azimuthal inhomogeneity as to each sample due to the adjacent sample. An example of spinning apparatus to accomplish concurrent spinning of individual samples about their respective axes is shown in FIG. 6. A common stator housing 105 supports respective rotors 107 and 109 on an airbearing supplied through jets 110-114. The stator housing 105 includes inserts 106 (and 106') forming plenum 108 (and 108'). The sample tubes 116 and 118 are spun in standard fashion through the action of drive gas from jet 115 on the turbine portion 117 and 117' of the respective samples. The details for construction of airbearing spinners is beyond the scope of the present invention. The discussion of such apparatus is contained in U.S. Pat. No. 4,275,350, commonly assigned.

Parallel (non-colinear) aligned multiple samples may again be arranged for superposition of the resonant signals in a common observe coil or alternatively in a multi-channel arrangement whereby separate sample signals are processed through respective observe coils and corresponding channel processing similar to that of FIG. 3.

The present invention provides economical utility of NMR spectroscopy facilities, expanding the use of same. Throughput, as measured by the rate at which samples can be processed, is increased by the parallel concurrent data acquisition of plural samples.

Although the invention has been shown and described with reference to preferred embodiments, it will be readily apparent to one of average skill in the art that various changes in the form and arrangement of the components of the invention may be made to satisfy particular requirements without departing from the scope of the invention as defined by the appended claims.

What is claimed is:

1. Nuclear magnetic resonance apparatus for concurrent analysis of discrete samples of disparate character comprising:

high resolution nuclear magnetic resonance analysis apparatus, a sample tube adapted to support said samples in axial alignment, each said sample comprising a solvent and all said solvents exhibiting substantially similar volume magnetic susceptability, adjacent said samples separated by a delimiter comprising a material selected to substantially match the volume magnet susceptability of adjacent solvents.

2. Nuclear magnetic resonance apparatus for concurrent analysis of discrete samples of similar character comprising:

nuclear magnetic resonance analysis apparatus comprising a source of excitation energy and means for common application thereof to said plurality of samples, a plurality of signal detection channels, a sample tube adapted to support said plurality of samples in axial alignment, each said sample comprising a solvent and all said solvents exhibiting substantially similar volume magnetic susceptability, adjacent said samples separated by a delimiter comprising a material selected to substantially match the volume magnetic susceptibility of adjacent said solvents, said plurality of signal detection channels comprising a first plurality of observe coils each arranged to couple to respective said samples, each said coil communicating with respective RF processing apparatus whereby signals from respective samples are separately processed to obtain therefrom respective resonance spectra.

3. Nuclear magnetic resonance apparatus for a concurrent analysis of discrete samples comprising: nuclear magnetic resonance analysis apparatus comprising excitation means for common application thereof to said plurality of samples,
a plurality of signal detection channels for analyzing each of said plurality of samples,
a plurality of sample tubes adapted to support said plurality of samples in parallel non-colinear alignment of said sample tubes, each said signal detection channel comprising an observed coil for coupling said signal channel to a respective one of said plurality of samples.

* * * * *